United States Patent [19]
Watabe

[11] 3,812,514
[45] May 21, 1974

[54] APPARATUS FOR FINISHING PHOTO-SENSITIVE RESIN BOARDS INTO RELIEF PRINTING PLATES

[76] Inventor: Kaname Watabe, No. 11-15 Yanakawa-cho 1-chome, Osaka, Japan

[22] Filed: Mar. 2, 1973

[21] Appl. No.: 337,477

[30] Foreign Application Priority Data

Mar. 7, 1972 Japan .............................. 47-23434

[52] U.S. Cl. ............................ 354/317, 354/325
[51] Int. Cl. ............................................ G03d 5/04
[58] Field of Search .............................. 95/89 R, 93

[56] References Cited

UNITED STATES PATENTS

| | | | |
|---|---|---|---|
| 3,727,536 | 4/1973 | Bunker | 95/93 X |
| 3,559,558 | 2/1971 | Hamlin et al. | 95/93 |
| 2,519,337 | 8/1950 | Alberts et al. | 95/93 X |
| 3,271,226 | 9/1966 | Staehle et al. | 95/89 R X |
| 3,604,331 | 9/1971 | Carberry et al. | 95/89 R |

*Primary Examiner*—Fred L. Braun
*Attorney, Agent, or Firm*—Wenderoth, Lind & Ponack

[57] ABSTRACT

An apparatus is provided for finishing photo-sensitive resin boards exposed to ultraviolet rays through negative into relief printing plates. The apparatus comprises a tank for wash-out solution, a rotary cylindrical body above the tank, wash-out nozzle for dissolving and removing non-exposed portions of the photo-sensitive resin board attached on the peripheral surface of the rotary body, mercury arc lamps for drying and post-exposure treatments provided adjacent to the peripheral surface of the rotary body, and a driving device for controlling rotations of the cylindrical body to intermittently position the resin board opposite to the wash out nozzles and mercury arc lamps.

3 Claims, 2 Drawing Figures

APPARATUS FOR FINISHING PHOTO-SENSITIVE RESIN BOARDS INTO RELIEF PRINTING PLATES

Figure 1:
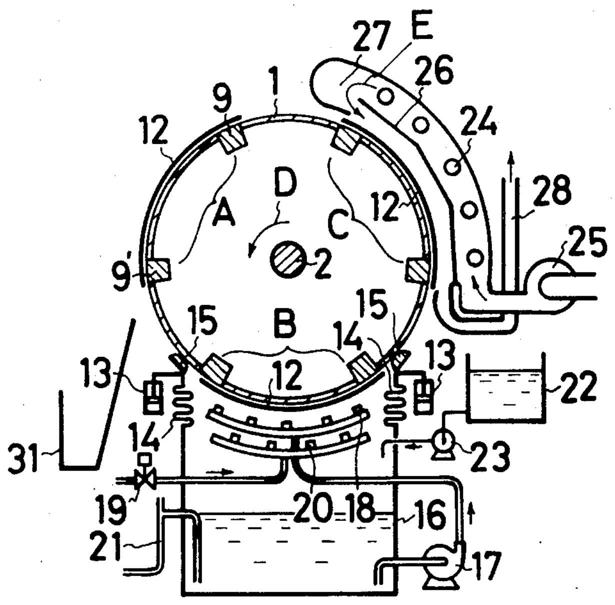

This invention relates to an apparatus for finishing photosensitive resin boards into relief printing plates .

It is known to make relief printing plates from photosensitive resin material. In a known method, a photosensitive resin layer provided at one surface thereof with a negative and at the other surface thereof with a base plate such as metal plate is exposed to ultraviolet rays through the negative to make the exposed portions of the layer insoluble due to photo-polymerization reaction. Thus obtained resin board is then subjected to finishing treatments to make a printing plate. In the finishing treatments, the resin board is first washed-out by a wash-out solution, for example, an alkaline aqueous solution such as sodium carbonate or caustic soda, to dissolve and remove the non-exposed portions of the resin board. Then, the board is washed with a rinsing liquid such as water and then dried. Thereafter, the washed surface is subjected to a so-called post-exposure treatment in which the entire surface is again exposed to ultraviolet rays to be hardened for use as a relief printing plate.

However, in the known method, the wash-out treatment and rinsing treatment have been performed at different places, or a special means has been provided so as to prevent mixing of the wash-out solvent and the rinsing liquid, which results in complication of the operations and increases equipment costs. Furthermore, since the drying treatment and the post-exposure treatment have been performed by respective devices, it was hardly possible to meet the demands in this field for reducing the space occupied by the devices, reducing the production time of the printing plates, minimizing human labor, and so forth.

Moreover, though it is usual to use high pressure mercury-arc lamps for the post-exposure treatment, the output of desired wavelength (300 – 400 mμ) of the ultraviolet rays which is effective for speedily hardening the sensitive resin board is only 4 to 8 percent of the total input. Other visible rays and heat rays are discharged without use. In case a plurality of the mercury-arc lamps are juxtaposed for the above treatment, an air cooling system is required to prevent overheating of such lamps, resulting in poor working power efficiency.

Accordingly, an object of the present invention is to provide an apparatus in which plural means for finishing photo-sensitive resin boards into relief printing plates are compactly assembled so as to be operated with ease and installed in a small space.

Another object of the present invention is to provide an apparatus of the type as defined above in which drying and post-exposure treatments are performed at high efficiency to reduce the production time of the printing plates.

The present invention has been accomplished on the basis of the fact that, even if wash-out solution having been used for dissolving and removing the non-exposed portions of the photo-sensitive resin board is mixed with rinsing liquid having been used for washing the board, the mixed liquid can be used as the wash-out solution if concentrated fresh wash-out solution is added thereto at one side while discharging the overflowing mixed liquid at the other side to adjust the concentration thereof. Thus, in the present invention, there exists only a single tank for the wash-out solution and the used rinsing liquid.

If the increment resulting from the mixing of the wash-out solution and the rinsing liquid is discharged by overflow, the discharged liquid contains dissolved materials from the resin board, which amount is substantially equal to that being newly dissolved from the resin board, so that the concentration of the dissolved materials in the mixed liquid is substantially constant. Accordingly, if added to the concentrated fresh wash-out solution, the mixed liquid will come to have a desired concentration and can be reused as wash-out solution.

An apparatus according to the present invention includes a rotary cylindrical body provided with means for attaching and detaching photo-sensitive resin boards along the peripheral surface thereof. Wash-out means and rinsing means are provided adjacent to the cylindrical body for dissolving and removing non-exposed portions of the photo-sensitive resin board and for washing the resin board, respectively. Below the wash-out means and rinsing means is provided a tank to receive washed-out solution and used rinsing liquid therein. The tank has means for supplying concentrated fresh wash-out solution therein, means for discharging overflowing liquid therefrom, and means for circulating the washed-out solution and used rinsing liquid to the wash-out means. Means for drying and post-exposure treatments is provided adjacnet to the peripheral surface of the cylindrical body for treating the washed-out resin boards. The cylindrical body is intermittently rotated about its horizontal axis by a rotation control means so that the resin boards are rotated in turn to places opposite to the respective washout and rinsing means and treating means.

According to such arrangement in which every means necessary for finishing the photo-sensitive resin boards to the printing plates is disposed round the cylindrical body rotatable about its horizontal axis above the tank, only a very small space is required for installation. For instance, in case of an apparatus for finishing the photo-sensitive resin boards into the relief printing plates for news papers, an area of only 1.5m × 1.5m is required for installation of such apparatus including all necessary attachments.

Preferably, the means for drying and post-exposure treatments is constructed in such a manner that several mercury-arc lamps are disposed in a chamber partially defined by a glass pane. The glass pane is opposite to the peripheral surface of the cylindrical body and defining a passage therebetween. This passage communicates with an outlet of the chamber. Cool air coming into the chamber travels through the outlet thereof along the passage. Thus, in this means, not only are the drying and post-exposure treatments performed simultaneously to reduce the treatment time, but also the cool air for the mercury-arc lamps is used also for drying, thereby improving the efficiency of electrical power.

Figure 2:
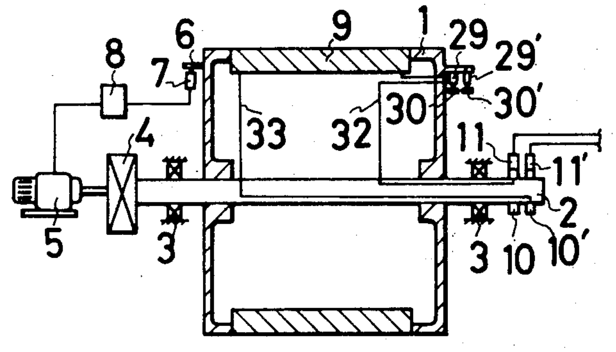

Other objects, features and advantages of the present invention will become apparent from the following description of a preferred embodiment thereof when taken in conjunction with the accompanying drawings, in which:

FIG. 1 is a cross-sectional view illustrating a mode of practice of an apparatus according to the present invention; and FIG. 2 is a vertical sectional view of the cylindrical section in the apparatus of FIG. 1.

Referring to FIGS. 1 and 2, a cylindrical body 1 is rotatably mounted above an upwardly opened tank 16 by a horizontal shaft 2 at the axis of the cylindrical body. The shaft 2 is supported by bearings 3. Driving means for the shaft 2 is powered by a motor 5 through a reduction gear 4. The motor 5 may have brake means therein. The driving means comprises three shoes 6 attached to a flat side surface of the cylindrical body 1 at places dividing the circumference of the cylindrical body 1 into three sections, a limit switch 7 secured to a stationary portion of the apparatus so as to take an ON or OFF position when it is kicked by the shoe 6 as the cylindrical body 1 rotates, and a sequence control circuit 8. The sequence control circuit 8 actuates the motor 5 to stop the rotation of the cylindrical body 1 when the limit switch 7 is kicked by a predetermined shoe 6. After a predetermined time has passed, the circuit 8 actuates the motor 5 to again rotate the cylindrical body 1, and when the limit switch 7 is again kicked by the next shoe 6, the above-said operation is repeated, thereby automatically repeating intermittant 120° rotation of the shaft 2 and hence the cylindrical body 1. Letters A, B and C in FIG. 1 show the three circumferantial positions divided in the above manner, and arrow D shows the rotary direction of the shaft 2. Inside of the cylindrical body 1 at the circumferential positions A, B and C are provided means 9 and 9′ for attaching and detaching photo-sensitive resin boards 12. In the embodiment shown, each means consists of a pair of electromagnets 9, 9′ arranged to magnetically attract both ends a base plate of each photo-sensitive resin board 12. The three pairs of such electromagnets are provided at the respective circumferential positions such that the outer faces of the electro-magnets are flush with the outer peripheral surface of the cylindrical body 1.

Usually, the cylindrical body 1 is made of a non-magnetic material such as, for example, stainless steel. The spaces at places where each of the elctromagnets 9, 9′ is attached to the cylindrical body 1 is sealed by a packing so that liquid applied to the resin board 12 will not leak into the inside of the body 1. A direct current for exciting each pair of the electro-magnets 9, 9′ is supplied from a DC source (not shown) to one end of coil of each electromagnet through a carbon brush 11 which is directly connected to the DC source, a collector ring 10 mounted electrically insulatively on the shaft 2, a lead wire 33 and a limit switch 29 or 29′ attached to a side surface of the cylindrical body 1, and is returned to the DC source from the other end of the coil through a lead wire 33, a collector ring 10′ and a carbon brush 11′. The limit switches 29, 29′ are adapted to cooperate with respective shoes 30, 30′ secured to the apparatus and arranged such that when the limit switches 29, 29′ are kicked by the respective shoes 30, 30′, the power to the electromagnets 9, 9′ is cut off, thereby dropping the associated photo-sensitive resin board into a receiver 31. It is desirable that this takes place at a point just before the resin board 12 comes to the position A where the cylindrical body 1 is stopped.

At the position B, the resin board 12 is located just above the opened tank 16. The tank 16 is provided at its open edges with elastic bellows 14 each of which has at its upper end an integrally formed packing 15. The bellows 14 is connected to a piston rod of a single action air cylinder 13. Thus, when compressed air is supplied to one side (or to the other side) of the air cylinder 13, the bellows 14 is expanded (or contracted) to force (or separate) the packing is against (or away from) the cylindrical body 1 to thereby seal (or open) the space between the packing and the cylindrical body In association with the tank 16 there is provided a wash-out solution spray system, rinsing liquid spray system, and fresh concentrated wash-out solution supply system. In the wash-out solution spray system, the wash-out solution in the tank 16 is sucked up by an external pump 17 and is conveyed to nozzles 18 in a header through a guide pipe, from where the wash-out solution is sprayed upwardly against the resin board 12. In the rinsing liquid spray system, rinsing liquid such as water supplied through an electromagnetic valve 19 is sprayed upwardly from nozzles 20 in a header against the resin board 12. In the fresh, concentrated wash-out solution supply system, fresh concentrated wash-out solution in a supplemental tank 22 is supplied to the main tank 16 by a small pump 23. The nozzles 18 and 20 and their headers are assembled to be swingable by traverse means (not shown) so that desired uniform wash-out and rinsing treatments for the resin board are insured. The tank 16 is also provided with an overflow discharge pipe 21.

Disposed opposite to the position C are several high pressure mercury-arc lamps 24 required for performing the post-exposure treatment within a short period of time, the lamps being housed in a chamber a part of which is defined by a glass pane 26. Connected to one end of the chamber is a fan 25 for supplying air for cooling the mercury lamps, and a bend 27 is formed at the other end of the chamber. The air supplied into the chamber by the fan 25 is U-turned by the bend 27 and guided into a passage defined between the glass pane 26 and the surface of the cylindrical body 1 or the photosensitive resin board 12 as shown by arrow E and then is discharged to the outside through a discharge duct 28. If desired, a heater may be provided inside of the bend 27.

The operation of the present apparatus shall be described hereinafter.

The photo-sensitive resin board 12, which has been exposed to ultraviolet rays through a negative to make the exposed portion insoluble, is placed by an operator along the circumferential section (position A) of the cylindrical body 1 such that both ends of the base plate of the resin board will be attracted by the respective electromagnets 9, 9′. Then a start button (not shown) is pushed to start the rotation of the motor 5, so that the cylindrical body 1 and the resin board 12 thereon are rotated. As soon as the resin board is automatically stopped at the position B, compressed air is supplied into the air cylinder 13. The bellows 14 expand out to force the integral packing 15 against the surface of the cylindrical body 1 to thereby seal the space between the cylindrical body and the bellows in a liquid-tight condition. Then the pump 17 is operated to spray the wash-out solution from the nozzles 18 to wash-out the non-exposed portions of the resin board 12. After a predetermined time has passed, the operation of the pump 17 is stopped and the electromagnetic valve 19 is opened to initiate spraying of the rinsing liquid from the nozzles 20 to thereby wash away the remaining wash-out solution on the surface of the board 12. Then, after a predetermined time has passed, the electromagnetic valve 19 is closed automatically.

The entire amount of the rinsing liquid used for the rinsing treatment is received in the tank 16, while the increment is discharged to the outside through the overflow pipe 21. In order to keep the concentration of the wash-out solution diluted by the rinsing liquid at a predetermined value, the small pump 23 is operated to supply fresh concentrated wash-out solution into the tank 16 for a fixed period of time.

In the meantime, compressed air is fed to the opposite side of the air cylinder 13 to lower the packing 15 and then the cylindrical body 1 is again rotated, the rotation thereof being continued until the washed resin board 12 reaches the position C where the cylindrical body is stopped. At this position C, the resin board 12 is exposed to ultraviolet rays from the mercury-arc lamps 24, so that the photo polymerization reaction is effected until the board develops a hardness sufficient to stand the printing operation exercised thereon. At the same time, the mercury lamp cooling air supplied from the fan 25 is heated as it passes around the the mercury-arc lamps 24, and this heated air, while passing toward the exhaust duct 28, performs the function of drying the board 12. When for instance, seven 1KW input mercury-arc lamps are used and cooling air is supplied at the rate of $15m^3$/min, the air contacting the board 12 has a temperature of 60° C. Thus, hot air is provided which has a temperature and velocity suited for performing the drying of the board 12.

Upon completion of the drying and post-exposure treatments, the cylindrical body 1 is again rotated until the treated resin board 12 reaches and is stopped at the position A. But it is to be noted here that immediately before the plate reaches the position A, power to the electromagnets 9, 9' is cut off to deenergize them, hereby dropping the board 12 into the receiver 31 as explained before.

As is apparent from the description mentioned above, all of the finishing processes are automatically performed under the control of the sequence control circuit, except the attachment of the resin board 12 at the position A and removal of the finished resin board from the receiver 31.

While the present invention has been described by way of a preferred embodiment thereof, it will be understood that the invention is not limited to the particular embodiment shown herein but various changes and modifications can be made within the scope of the invention. For example, the means for the drying treatment and the post-exposure treatment may be provided separately from each other. Also, in place of the electromagnets 9, 9', a vacuum suction means and a mechanical pressure means may be used for attaching and detaching the resin board 12.

What is claimed is:

1. An apparatus for finishing photo-sensitive resin boards into relief printing plates, comprising:

a rotary cylindrical body, said cylindrical body having means for attaching and detaching said photo-sensitive resin boards along the peripheral surface thereof;

wash-out means for applying a wash-out solution provided adjacent to said cylindrical body for dissolving and removing non-exposed portions of said photo-sensitive resin board attached on the peripheral surface of said rotary body;

rinsing means for applying a rinsing liquid provided adjacent to said cylindrical body for washing said photo-sensitive resin board;

a tank provided below said wash-out means and said rinsing means to receive the wash-out solution and the used rinsing liquid therein, said tank having means for supplying concentrated fresh wash-out solution thereto, means for discharging overflowing liquid therefrom, and means for recirculating said received washed-out solution and used rinsing liquid to said wash-out means;

means for drying and post-exposure treating the resin board subsequent to treatment thereof by said wash-out and rinsing means provided adjacent to the peripheral surface of said cylindrical body; and means for controlling rotations of said cylindrical body, said control means intermittently rotating said cylindrical body to oppositely position said resin board relative to the respective wash-out and rinsing means, and the drying and post-exposure treating means.

2. An apparatus as claimed in claim 1, wherein the upper ends of said tank are adjacent to said cylindrical body and said tank further comprises expansible bellows at its upper ends, said bellows having packings at the upper ends thereof and each being connected with a piston rod of a single action cylinder, whereby, when operative fluid material is fed into said cylinders to expand said bellows, said packings are pressed against the cylindrical surface of said body to seal the space formed therebetween.

3. An apparatus as claimed in claim 1, wherein said means for drying and post-exposure treating comprises a chamber having mercury-arc lamps disposed therein, said chamber being partially defined by a glass pane and forming an air passage for cooling said lamps, and having an air inlet and air outlet therein, said glass pane being disposed opposite to the peripheral surface of said cylindrical body to define another passage therebetween, said passages communicating with each other through said air outlet of said air passage for cooling said lamps.

* * * * *